United States Patent [19]
de Wilde

[11] 4,429,337
[45] Jan. 31, 1984

[54] MAGNETIC HEAD UNIT HAVING THERMALLY DISSIPATING COVER PLATE

[75] Inventor: Johannes de Wilde, Eindhoven, Netherlands

[73] Assignee: U.S. Philips Corporation, New York, N.Y.

[21] Appl. No.: 200,820

[22] Filed: Oct. 27, 1980

[30] Foreign Application Priority Data

Nov. 28, 1979 [NL] Netherlands .......................... 7908611

[51] Int. Cl.³ .................................................. G11B 5/20
[52] U.S. Cl. ...................................... 360/123; 360/125
[58] Field of Search ....................... 360/123, 121–122, 360/125–127, 112–113

[56] References Cited

U.S. PATENT DOCUMENTS 3,846,841 11/1974 Lazzari et al. ....................... 360/121
3,945,038 3/1976 Lazzari ................................. 360/113
4,052,749 10/1977 Nomura et al. ................. 360/127 X

FOREIGN PATENT DOCUMENTS 1307886 2/1973 United Kingdom .

Primary Examiner—John H. Wolff
Attorney, Agent, or Firm—Joseph P. Abate

[57] ABSTRACT

An integrated magnetic head unit includes a housing and a substrate provided in the housing. The substrate supports a plurality of electromagnetic transducing elements including respective transmission elements which are connected to bonding pads on the substrate. A silicon plate covers the transducing elements and is arranged in a good thermally-conducting relationship with the transducing elements and with the housing. The cover plate is arranged such that the bonding pads are exposed.

18 Claims, 8 Drawing Figures

MAGNETIC HEAD UNIT HAVING THERMALLY DISSIPATING COVER PLATE

BACKGROUND OF THE INVENTION

The invention relates to an integrated magnetic head construction or unit having a number of spatially separated electromagnetic transducing elements and having a plane for magnetic flux coupling of the transducing elements with a magnetic recording medium. The construction includes a layerwise formed pattern of electric conductors arranged on a common substrate of non-electrically conductive material provided in a housing, said pattern defining a number of inductive and/or magnetoresistive transmission elements which are each connected to bonding pads by at least two connection conductors, and includes a number of discrete magnetic layers, each of the transmission elements cooperating with a discrete magnetic layer to define one of the transducing elements, the transducing elements being sandwiched between the substrate and a cover plate of non-magnetic, non-electrically conductive material.

Such an integrated magnetic head construction is known from U.S. Pat. No. 3,846,841. That patent describes in particular an integrated magnetic head system including a substrate of glass or aluminium oxide and including a cover plate (with the same surface as the substrate) likewise of glass or aluminium oxide to protect the heads against mechanical detrition.

Such magnetic head constructions are suitable for recording and reading information stored on a magnetic layer. They are useful for industrial applications such as for information processing devices with disks, drums or magnetic tapes, and for less specialized applications such as reel-to-reel and cassette recorders. Especially for those kinds of applications where the heads are in contact with the record carrier during operation, the known head construction comprises a cover plate which ensures resistance of the construction against mechanical detrition. The cover plate is connected on the surfaces of the filling material in which the transducing elements are embedded and of flat conductors which are soldered on the bounding pads. Both due to this way of connecting (separated from the transducing elements by the filling layer) and by the choice of the material (glass or aluminium oxide), the dissipation of the heat evolved in the transducing elements particularly during recording is not entirely satisfactory. As a result, the temperature of the transducing elements during operation becomes too high which results in the deterioration of the magnetic properties of the magnetic layers and also results in the electrical conductors being interrupted or shortcircuited (fused) so that only small currents can be used.

SUMMARY OF THE INVENTION

It is the object of the invention to increase the current usable in operating an integrated magnetic head construction while maintaining its resistance against mechanical detrition. The integrated magnetic head construction according to the invention is characterized in that the cover plate is manufactured from a semiconductor material and that the plate is arranged in a good thermally-conducting relationship with both the transducing element and the housing. Particularly silicon has the combination of a coefficient thermal conductivity ($1.5 \times 10^{-2}$ W/m°K. against, for example, $Al_2O_3$: $0.3 \times 10^{-2}$ W/m°K. and a $SiO_2$; $0.08 \times 10^{-2}$ W/m°K.) and resistance to detrition (notably higher than that of metals having a comparable coefficient of thermal conductivity, for example Au: $3 \times 10^{-2}$ W/m°K.) which is unique for the purpose of the invention. The present construction in which the silicon cover plate is in good thermally-conducting relationship with the transducing element and with the housing ensures that the silicon cover plate actually fulfills its heat dissipating function provided by the invention. In the integrated head disclosed in U.S. Pat. No. 3,846,841, the cover plate, as a result of both the material from which it is manufactured and the manner in which it is provided, cannot fulfill a heat-exchanging function. In the head known from J.P. Patent Application Kokai No. 52-145019, while the current-carrying element is embedded between two thin semiconductor layers which aid the dissipation of heat generated in said element, no provision is made for a further dissipation of the heat from the semiconductor layers to the outside, in this case to the housing.

According to a preferred embodiment of the invention, the dimensions of the cover plate are chosen to leave the bonding pads exposed, after providing the cover plate so that it remains possible to connect (flexible) connection conductors to the pads. For this purpose, the so-called wire bond process which uses thermocompression methods whether or not in combination with ultrasonic vibrations is suitable.

A cover plate formed of silicon is also very practical in the case of series production. Since silicon is easily etched, rows of parallel grooves can simply be provided therein which become located above the bonding pads when connecting a unitary cover plate to a substrate provided with a plurality of transducing elements arranged in parallel rows.

An adhesive to be drawn by capillarity between the transducing elements and the unitary cover plate cannot cover the bonding pads due to the presence of the grooves above the latter. By grinding away the material above the grooves it can be ensured that, after adhesion has been effected, the bonding pads are exposed for the connection thereto of connection conductors.

It has been usual to use thin wafer substrates, for example, silicon wafers having a thickness of 0.5 mm. Within the scope of the invention, such a thin substrate may itself be glued to a thicker supporting plate of silicon (thickness of a few mm).

According to a further preferred embodiment of the invention, the substrate itself is formed by a block of silicon having a thickness which corresponds to that of the cover plate. The use of a thick silicon wafer as a substrate (or as a supporting plate for a substrate) has for its advantage that a better defined straight edge can be provided on a thick wafer (by sawing or grinding) than on a thin wafer. A well defined edge is of great importance for the front face because the transducing elements are in magnetic flux coupling with a magnetic recording medium through the face ultimately formed.

The invention also relates to a method of manufacturing an integrated magnetic head construction (unit) as hereinbefore described.

BRIEF DESCRIPTION OF THE DRAWING

The invention will be described, by way of example, with reference to the drawing, in which.

DESCRIPTION OF THE PREFERRED EMBODIMENTS

Figure 1:
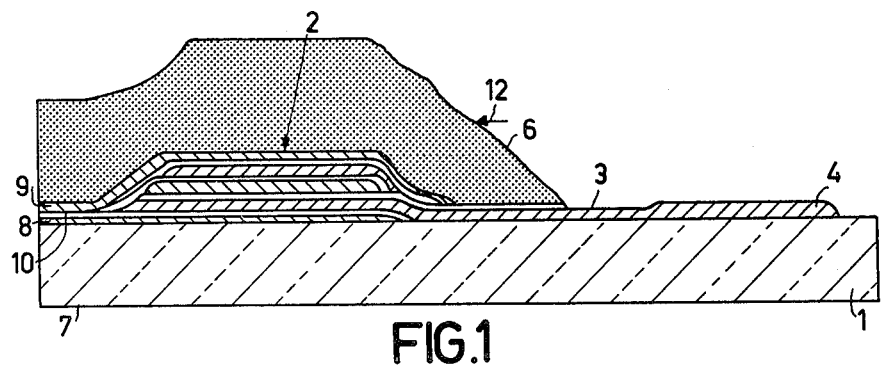
FIG. 1 is a side sectional view of an integrated magnetic head construction during its manufacture.

Referring now to the figures and FIG. 1 in particular, there is shown a construction having a magnetic head or transducing element 2 including thin layers provided one on top of the other on a substrate 1 of detrition-resistant, non-electrically conductive material for which silicon is very suitable. This construction has a pair of layers 8, 9 of magnetizable material, usually a $Ni_{20}Fe_{80}$ alloy whose airgap ends are separated by an insulating layer 10. For illustration, there is shown between these layers 8, 9 a transmission element in the form of a suitably insulated multi-layer spiral-like winding whose output connections extend towards the rear 3 for connection to conductors 5 (FIGS. 2, 3) by means of a bonding method as indicated at the part 4.

During its formation, the head 2 is not covered and in order to ensure its protection against corrosive influences and mechanical detrition, a "primary" protection layer 6 of insulation material is provided. This layer may, for example, be sputtered silicon which also readily fills the cavities between the heads (see FIG. 4). Other possibilities are sputtered glass and vapor deposited aluminium oxide. The primary protection material 6 leaves the rear part of the conductors 3 exposed where these terminate into thicker "flaps" 4 of, for example, 10 microns with a thickness of the head 2 of 50 microns in the case in which this comprises a ten-turn-spiral. It is shown in FIG. 1 that the layer 6 was initially provided with a thickness exceeding that proposed in the construction after connection of a cover plate 7 (FIG. 2).

It is thus necessary to reduce this thickness to the required value, for example, by grinding the material of the layer 6 down to the level 12. The object of this arrangement can be understood by considering the sectional view of FIG. 4 which is taken along a plane perpendicular to the sectional plane of FIGS. 2 and 3. In FIG. 4, the material of the protection layer 6 fills substantially the whole space between the substrate 1 and the cover plate 7. The cover plate 7 which, according to the invention, consists of silicon may be secured to the layer 6 by means of a thin layer of adhesive (1 to 2 microns thick). When the layer 6 consists of sputtered silicon, the oppositely located surfaces of the cover plate 7 and the layer 6, however, may also be adhered together advantageously by means of a diffusion bonding which requires that a metallic layer (for example gold) be first provided on at least one of said surfaces.

Figure 3:
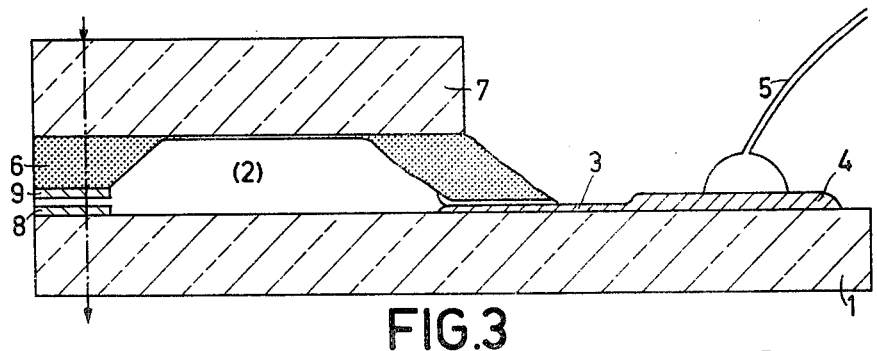
Figure 4:
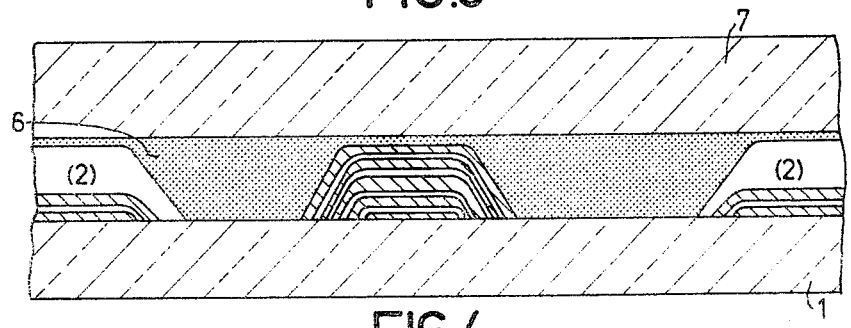
FIG. 4 is a sectional view taken along a plane perpendicular to that of FIGS. 1-3 and relates to an elementary construction having several transducing elements which are supported by the same substrate.

FIG. 3 shows that the cover plate 7 may also be adhered directly to the head 2 by means of forming the protective layer 6. In this case, the adhesive has been drawn between cover plate 7 and head 2 by capillary action. This latter method is particularly suitable when the head 2 is thin, for example, when the transmission element consists of one turn or of a magnetoresistive strip. In these cases, the thickness of the head 2 is not more than a few microns and the adhesive can then easily fill the cavities between adjacent heads. The seam of adhesive itself has a thickness of not more than a few tenths of a micron.

Figure 2:
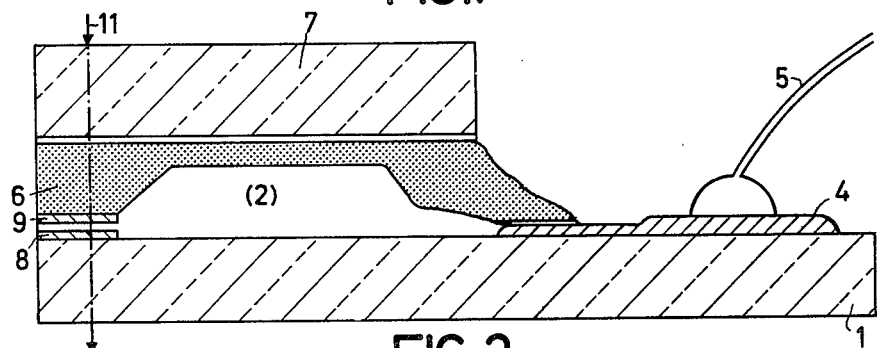
FIGS. 2 and 3 are two similar sectional views showing the formation of magnetic head constructions in accordance with the invention.

It is furthermore shown in FIGS. 2 and 3 that, after providing the cover plate, a part of the construction on the left of the sectional line 11 can be removed by means of a sawing operation, if desired, succeeded by a grinding operation. In this manner, the depth of the gap, i.e. the distance over which the magnetizable layers 8, 9 overlap each other on the left-hand side of the construction, can be adjusted at a uniform value for a large number of heads simultaneously (compare FIG. 4). The cover plate enables so-called "covered" sawing. As a result, the saw-cut can be provided close to the ultimately desired front face of the heads without crumbling-away being feared. The closer the saw-cut is situated near the ultimate front face, the shorter need be the time necessary after sawing to polish the front face.

Figure 5:
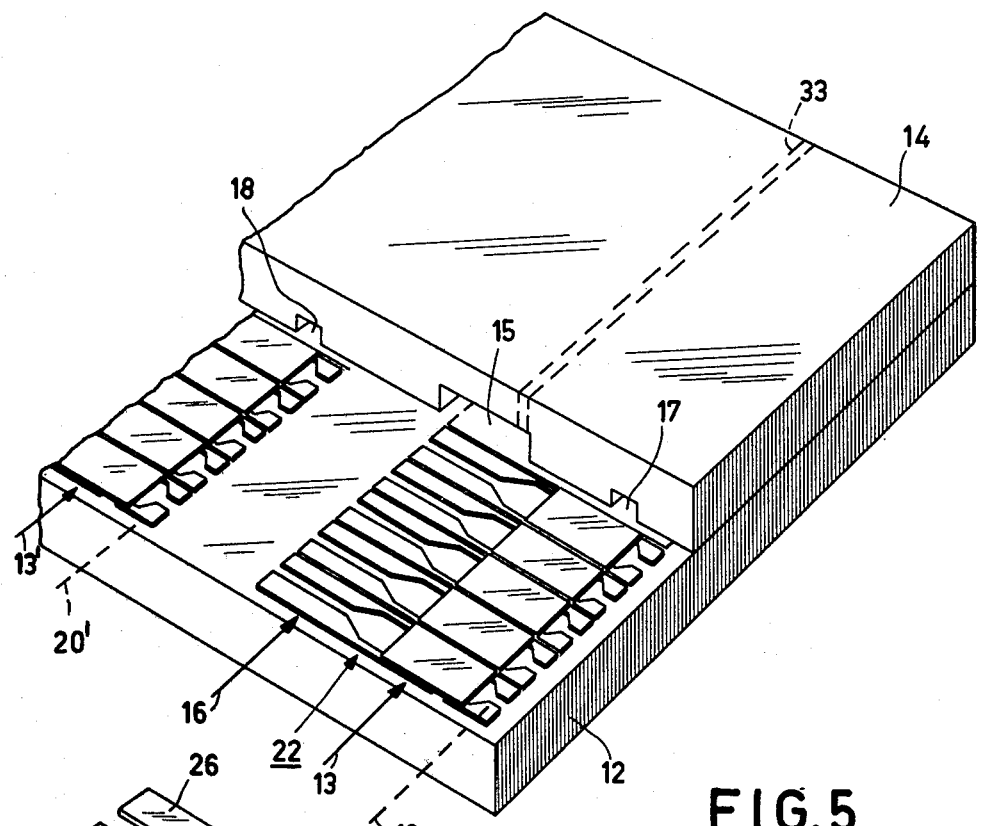
FIG. 5 is a perspective view of an integrated magnetic head construction in accordance with the invention during a stage of the manufacture.

It will now be explained with reference to FIG. 5 what special role the cover plate plays in the method according to the invention.

Rows 13, 13' etc. of electromagnetic transducing elements are provided on a substrate 12, preferably a slice of silicon of a few mm (for example 2 mm) thickness. A cover plate 14 of silicon is pressed on and covers the transducing elements. Plate 14 has a thickness of a few mm and includes grooves 15 which are each situated exactly above a row of bonding pads 16. The grooves 15 extend in a direction transverse of the bonding pads. An adhesive is now supplied which is drawn by capillarity between the plate 14 and the transducing elements. The width of the groove 15 is such that the adhesive cannot cover the row of bonding pads 16. In order to facilitate the capillary action, the plate 14 may be provided with auxiliary grooves 17, 18 etc. The adhesive also fills the cavities between the individual transducing elements. The grooves 15, 17, 18, etc. can be obtained by means of an etching step wherein the grooves 15 are etched in the cover plate surface which faces the bonding pads. Silicon can be readily etched. When a conventional etchant is used, the etching rate is 15 microns per minute. When electrochemical etching is used, the etching rate may even be 25 microns per minute.

After cementing the plate 14, the construction is severed into strips such as by sawing along lines 19, 20 etc. Each strip comprises a row of transducing elements.

Figure 6:
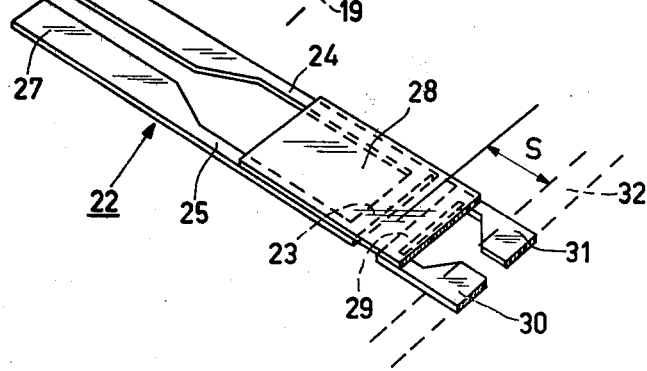
FIG. 6 is a diagrammatic view of a transducing element as used in the construction shown in FIG. 5.

Because the plate 14 leaves the outermost transducing elements of the rows 13, 13' exposed, these elements may be useful in aligning the saw. FIG. 6 shows diagrammatically by way of example a transducing element 22 (in this case a writing head) which can easily be used for this alignment. The element 22 which comprises a single electric winding 23, connection conductors 24 and 25, bonding pads 26 and 27 and a discrete magnetizable shield 28, has on its front side a second winding 29 which is connected to two bonding pads 30 and 31. The winding 29 together with the ferrite shield 28 constitutes a so-called "counter" head with which the operation of element 22 can be measured by means of induction. The bonding pads 30 and 31 of the counter-head are well visible and it is simple to provide a saw-cut 32 through it. The distance S of the saw-cut up to the ultimately desired head front face is only a few tenths microns. During the grinding process succeeding the sawing, electric grinding characteristics provided on the substrate are used. The resistance of the grinding characteristic is followed on a recorder until a desired resistance has been reached. The grinding accuracy can then be approximately 10 microns.

After the construction has been sawn into strips, the rows of bonding pads should still be exposed so as to be able to connect the connection conductors. This exposure can be done very simply by removing the material above the grooves 15, entirely or partly by sawing or milling, so that the parts of the plate 14 on the left of the removed material 33 become detached.

After connecting the connection conductors, which may consist of flexible wires or of conductor tracks provided on a flexible foil, the resulting strips may be enveloped with synthetic resin, if desired, and the front faces may be provided with a desired profile.

A large number of integrated magnetic head constructions consisting of strips with transducing elements of the type shown in FIG. 6 provided with cover plates have been tested for their usefulness. As a result of the use of the silicon cover plates, the heat dissipation of the transducing elements proved to be so good that, when a current of 1,500 mA was passed through the winding, the heads did not fuse whereas, without the use of a silicon cover plate (which was arranged in good thermoconductive contact with the transducing elements and the housing), the heads fused with a current of 200 mA. Temperature measurements also showed that there was no accumulation of thermal energy in the transducing elements; the temperature difference between a transducing element and its surroundings was approximately 3° C. with a dissipation of 1.6 Watts, whereas in the same circumstances in a transducing element without a silicon cover plate this difference was approximately 50° C. or more.

It should be noted that ferrite may be used as a material for the non-electrically conductive substrate. This simplifies the manufacture of the heads, because a ferrite substrate also plays the role of the magnetizable layer 8 (FIGS. 1, 2 and 3), so that this need not be provided separately. See, for example Great Britain Pat. No. 1,307,886. Since ferrite is a poor heat conductor, (the coefficient of thermal conductivity is $6 \times 10^{-2}$ W/cm °K.), the use of a silicon cover plate according to the invention, in case a ferrite substrate is used, is particularly important to prevent head damage due to the temperature rising too high.

Figure 7:
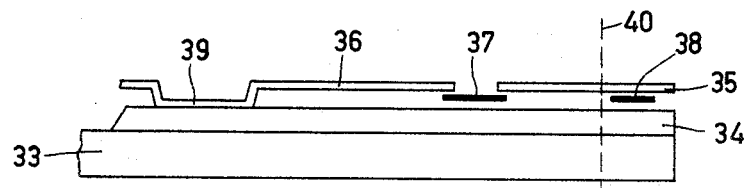
FIG. 7 is a side sectional view through a transducing element of the magnetoresistive type.

The transducing element 22 shown in FIG. 6, instead of being a head of the inductive type having a winding 23, may also be a head of the magnetoresistive type, in which case 23 denotes a strip of magnetoresistive material. FIG. 7 shows diagrammatically a side sectional view of such a magnetoresistive head. A substrate 33 supports a layer of magnetizable material 34 which, at portion 39, is coupled magnetically to a discrete layer of magnetizable material which consists of two parts 35, 36 and defines the track width, the so-called flux conductor. Between the parts 35, 36, there is a slot which is bridged magnetically by a magnetoresistor 37 whose connection conductors are not shown in the drawing. In this configuration also, a counter winding 38 comparable to the counter winding 29 of FIG. 6 may be present. The part to the right of the line 40 is not present in the ultimate head. The combination of a (non-magnetizable, non-electrically conductive) substrate 33 with a layer of magnetizable material 34 may be replaced, if desired, by a substrate of ferrite. In the case of an integrated magnetic head construction having transducing elements of the magnetoresistive type, good heat dissipation by means of a cover plate 14 in FIG. 5 is important because, as a result of the frictional contact of such a construction with a record carrier, heat is produced which, if not dissipated uniformly, causes so-called temperature noise. In this case also, the use of a silicon cover plate in accordance with the invention is particularly important when a ferrite substrate is used.

Figure 8:
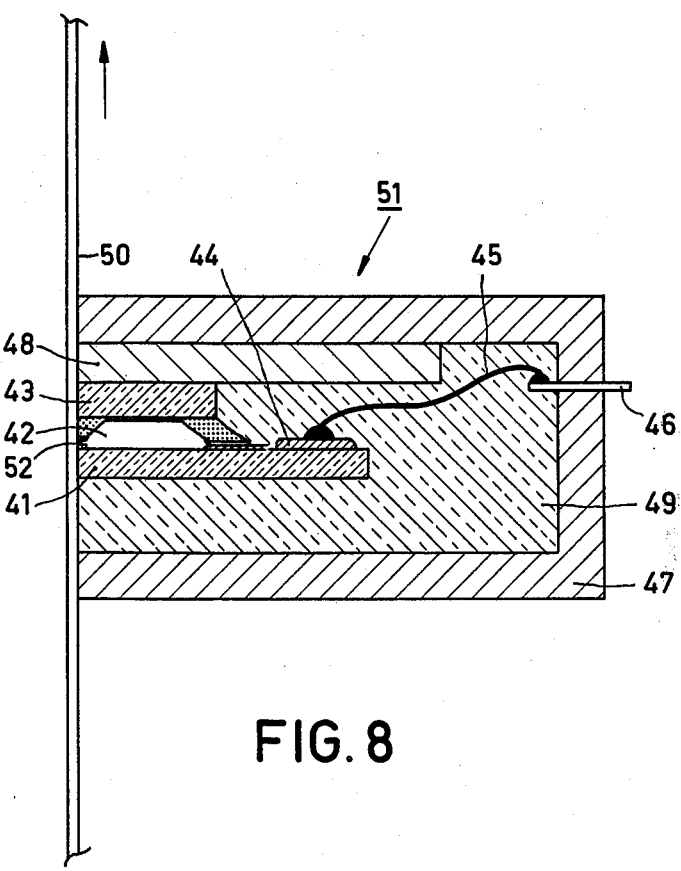
FIG. 8 is a side sectional view of an integrated magnetic head construction as shown in FIG. 3 after being accommodated in a housing.

It is highly important that the heat absorbed by the silicon cover plate be dissipated to the atmosphere. In order to ensure this, the assembly of substrate-transducing elements-cover plate is preferably incorporated within a metal housing and arranged such that the cover plate is in thermal contact with a wall of the housing. This will be explained with reference to FIG. 8 which is a side sectional view of a substrate 41 with one of the transducing elements 42 across which a cover plate 43 formed by a block of silicon is provided. Transducing element 42 is connected to a bonding pad 44. Bonding pad 44 in turn is connected to a connection pin 46 via a flexible connection wire 45. Connection pin 46 is provided in the wall of a housing 47 which is preferably manufactured from a metal, for example, aluminum. A block 48 of brass provided between the wall of the housing 47 and the cover plate 43 ensures that the transducing gap 52 is situated in the center of the whole construction. However, block 48 may also be omitted. The remaining space in the housing 47 is filled with a moulding mass 49.

After having been in contact for more than 500 hours with a magnetic tape 50 moved at a speed of 4.75 cm/sec, the properties of the head 51 and in particular the dimensions of the transducing gap 52 proved to be unchanged.

What is claimed is:
1. A magnetic head unit, comprising:
a housing;
a non-electrically conductive substrate provided in said housing;
a transmission element provided on said substrate;
at least one discrete magnetic layer cooperating with said transmission element to define a magnetic head, and
a cover plate of non-magnetic material, said magnetic head being disposed between said substrate and said cover plate;
characterized in that said cover plate is formed of a semiconductor material and is arranged in a good thermally-conducting relationship with said head and with said housing.
2. A magnetic head unit, comprising:
a housing;
a non-electrically conductive common substrate provided in said housing;
a plurality of magnetic transducing elements arranged in a row on said substrate, each of said transducing elements comprising a transmission element and at least one discrete magnetic layer cooperating with said transmission element to define a transducing element, and
a cover plate of non-magnetic material, said transducing elements being disposed between said substrate and said cover plate;

characterized in that said cover plate is formed of a semiconductor material and is arranged in a good thermally-conducting relationship with said transducing elements and with said housing.

3. A unit as claimed in claim 2, comprising in addition bonding pads electrically connected to said respective transmission elements, characterized in that said plate is arranged such that the bonding pads are exposed.

4. A unit as claimed in claim 2, further including a layer of protective material in which said transducing elements are embedded, and a layer of adhesive provided on said layer of protective material, characterized in that said cover plate is adhered to said layer of protective material by means of said layer of adhesive.

5. A unit as claimed in claim 4, characterized in that said transmission elements are inductive elements.

6. A unit as claimed in claim 4, characterized in that said transmission elements are magnetoresistive elements.

7. A unit as claimed in claim 2, characterized in that a layer of adhesive secures said cover plate to said elements.

8. A unit as claimed in claim 7, comprising in addition bonding pads electrically connected to said respective transmission elements, characterized in that said magnetic head unit is manufactured by covering said transducing elements with a plate having a surface which faces said bonding pads, said surface forming part of a groove extending transversely of said pads, and then removing material above said groove to expose said pads.

9. A unit as claimed in claims 1 or 2, characterized in that said substrate is formed of a ferrite material.

10. A unit as claimed in claims 1 or 2, characterized in that said cover plate has a thickness of a few millimeters, and that said substrate is formed of silicon and is substantially the same thickness as said cover plate.

11. A unit as claimed in claim 3, characterized in that said unit includes flexible connection conductors connected to said bonding pads.

12. A head unit as claimed in claim 3, wherein said semiconductor material is silicon.

13. A head unit as claimed in claim 10, wherein said semiconductor material is silicon.

14. A magnetic head unit, comprising:
a housing;
a non-electrically conductive substrate provided in said housing;
a plurality of magnetic transducing elements arranged in a row on said substrate, each of said transducing elements comprising a transmission element and at least one discrete magnetic layer cooperating with said transmission element to define a transducing element, and
a cover plate of a non-magnetic material, said transducing elements being disposed between said substrate and said cover plate;
characterized in that said cover plate consists essentially of silicon and is separated from and adhered to said transducing elements by a protection layer having a thickness of less than a few tenths of a micron, and that said plate is arranged in a good thermally-conducting relationship with said housing, so that heat is transferred from said transducing elements to said housing during normal operation of said magnetic head unit.

15. A head unit as claimed in claim 14, characterized in that said housing includes a metal wall arranged in thermal contact with the ambient atmosphere, and that said cover plate is arranged in thermal contact with said wall.

16. A head unit as claimed in claim 15, characterized in that a block formed of brass is arranged between and thermally contacts said wall and said cover plate.

17. A head unit as claimed in claim 16, characterized in that said wall consists essentially of aluminum.

18. A head unit as claimed in claim 17, characterized in that said protection layer includes silicon.

* * * * *